(12) United States Patent
Dedic

(10) Patent No.: US 6,344,816 B1
(45) Date of Patent: Feb. 5, 2002

(54) REDUCING JITTER IN MIXED-SIGNAL CIRCUITRY

(75) Inventor: Ian Juso Dedic, Northolt (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/666,164

(22) Filed: Sep. 19, 2000

(30) Foreign Application Priority Data

Nov. 24, 1999 (GB) .............................................. 9927804

(51) Int. Cl.⁷ .............................................. H03M 1/06
(52) U.S. Cl. ..................................................... 341/144
(58) Field of Search .............................. 341/144, 143, 341/156, 155, 76, 120, 141

(56) References Cited

U.S. PATENT DOCUMENTS

| | | | | |
|---|---|---|---|---|
| 6,111,532 A | * | 8/2000 | Hirano | 341/144 |
| 6,278,394 B1 | * | 8/2001 | May | 341/144 |

FOREIGN PATENT DOCUMENTS

| | | |
|---|---|---|
| GB | 2 333 171 | 7/1999 |
| GB | 2 333 190 | 7/1999 |
| GB | 2 333 191 | 7/1999 |
| GB | 2 335 097 | 9/1999 |

OTHER PUBLICATIONS

International Publication No. WO 98/26507; published Jun. 18, 1998; Method and Circuit for Mitigation of Array Edge Effects.

Serial No.: 09/227,202; filed Jan. 8, 1999; Title: Switch Driver Circuitry Now U.S. Pat. No. 6,100,830.

Serial No.: 09/227,200; filed Jan. 8, 1999; Title: Thermometer Coding Circuitry.

Serial No.: 09/137,837; filed: Aug. 21, 1998; Title: Cell Array Circuitry.

Serial No.: 09/227,201, filed:Jan. 8, 1999; Title: Mixed–Signal Circuitry and Integrated Circuit Devices.

Serial No.: 09/227,254; filed: Jan. 8, 1999; Title Electrostatic Discharge Protectin in Semiconductor Devices.

Serial No.: 09/382,459; filed: Aug. 25, 1999; Title: Jitter Reduction.

* cited by examiner

Primary Examiner—Brian Young
(74) Attorney, Agent, or Firm—Arent Fox Kintner Plotkin & Kahn, PLLC

(57) ABSTRACT

Mixed-signal circuitry, used for example in a digital-to-analog converter, comprises digital circuitry (120) and analog circuitry. The analog circuitry receives a digital control signal (TCK) and produces one or more analog signals in dependence upon the received digital control signal. The digital circuitry comprises a main clocked circuit (122), clocked by an applied clock signal (CLK), and having an output (Q) at which the digital control signal (TCK) is generated. The main clocked circuit (122) causes the digital control signal (TCK) to change selectively at edges of the clock signal (CLK). A dummy clocked circuit (124), also clocked by the clock signal (CLK), produces a dummy signal (DTCK) at an output (Q) thereof.

16 Claims, 8 Drawing Sheets

| BINARY INPUT WORD | | | THERMOMETER-CODED SIGNALS | | | | | | |
|---|---|---|---|---|---|---|---|---|---|
| D3 | D2 | D1 | T7 | T6 | T5 | T4 | T3 | T2 | T1 |
| 0 | 0 | 0 | 0 | 0 | 0 | 0 | 0 | 0 | 0 |
| 0 | 0 | 1 | 0 | 0 | 0 | 0 | 0 | 0 | 1 |
| 0 | 1 | 0 | 0 | 0 | 0 | 0 | 0 | 1 | 1 |
| 0 | 1 | 1 | 0 | 0 | 0 | 0 | 1 | 1 | 1 |
| 1 | 0 | 0 | 0 | 0 | 0 | 1 | 1 | 1 | 1 |
| 1 | 0 | 1 | 0 | 0 | 1 | 1 | 1 | 1 | 1 |
| 1 | 1 | 0 | 0 | 1 | 1 | 1 | 1 | 1 | 1 |
| 1 | 1 | 1 | 1 | 1 | 1 | 1 | 1 | 1 | 1 |

REDUCING JITTER IN MIXED-SIGNAL CIRCUITRY

BACKGROUND OF THE INVENTION

1. Field of the Invention

The present invention relates to reducing jitter in mixed-signal circuitry, for example in digital-to-analog converters (DACs). Such circuitry includes a mixture of digital circuitry and analog circuitry.

2. Description of the Related Art

FIG. 1 of the accompanying drawings shows parts of a conventional DAC of the so-called "current-steering" type. The DAC 1 is designed to convert an mbit digital input word (D1–Dm) into a corresponding analog output signal.

The DAC 1 contains analog circuitry including a plurality (n) of identical current sources $2_1$ to $2_n$, where $n=2^{m-1}$. Each current source 2 passes a substantially constant current I. The analog circuitry further includes a plurality of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the differential-switching-circuit first terminals, and a second output current $I_B$ of the DAC 1 is the sum of the respective currents delivered to the differential-switching-circuit second terminals.

The analog output signal is the voltage difference $V_A-V_B$ between a voltage $V_A$ produced by sinking the first output current $I_A$ of the DAC 1 into a resistance R and a voltage $V_B$ produced by sinking the second output current $I_B$ of the converter into another resistance R.

In the FIG. 1 DAC the thermometer-coded signals T1 to Tn are derived from the binary input word D1–Dm by digital circuitry including a binary-thermometer decoder 6. The decoder 6 operates as follows.

When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A=0$ and $V_B=nIR$. The analog output signal $V_A-V_B=-nIR$.

As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A-V_B$ is equal to $(2i-n)IR$.

FIG. 2 shows an example of the thermometer-coded signals generated for a three-bit binary input word D1–D3 (i.e. in this example m=3). In this case, seven thermometer-coded signals T1 to T7 are required ($n=2^m-=7$).

As FIG. 2 shows, the thermometer-coded signals T1 to Tn generated by the binary-thermometer decoder 6 follow a so-called thermometer code in which it is known that when an rth-order signal Tr is activated (set to "1"), all of the lower-order signals T1 to Tr–1 will also be activated.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

However, when it is desired to operate such a DAC at very high speeds (for example 100 MHz or more), it is found that glitches may occur at one or both of the first and second connection lines A and B, producing a momentary error in the DAC analog output signal $V_A-V_B$. These glitches in the analog output signal may be code-dependent and result in harmonic distortion or even non-harmonic spurs in the output spectrum.

Some causes of these glitches have been determined to be as follows.

Firstly, the digital circuitry (the binary-thermometer decoder 6 and other digital circuits) is required to switch very quickly and its gate count is quite high. Accordingly, the current consumption of the digital circuitry could be as much as 20 mA per 100 MHz at high operating speeds. This combination of fast switching and high current consumption inevitably introduces a high degree of noise into the power supply lines. Although it has previously been considered to separate the power supplies for the analog circuitry (e.g. the current sources $2_1$ to $2_n$ and differential switching circuits $4_1$ to $4_n$ in FIG. 1) from the power supplies for the digital circuitry, this measure alone is not found to be wholly satisfactory when the highest performance levels are required. In particular, noise arising from the operation of the binary-thermometer decoder 6 can lead to skew in the timing of the changes in the thermometer-coded signals T1 to Tn in response to different changes in the digital input word D1 to Dm. For example, it is estimated that the skew may be several hundreds of picoseconds. This amount of skew causes significant degradation of the performance of the DAC and, moreover, being data-dependent, the degradation is difficult to predict.

Secondly, in order to reduce the skew problem mentioned above, it may be considered to provide a set of latch circuits, corresponding respectively to the thermometer-coded signals T1 to Tn, between the digital circuitry and the analog circuitry, which latches are activated by a common timing signal such that the outputs thereof change simultaneously. However, surprisingly it is found that this measure alone is not wholly effective in removing skew from the thermometer-coded signals. It is found, for example, that data-dependent jitter still remains at the outputs of the latch circuits and that the worst-case jitter increases in approximate proportion to the number of thermometer-coded signals. Thus, with (say) 64 thermometer-coded signals the worst-case jitter may be as much as 20 picoseconds which, when high performance is demanded, is excessively large.

SUMMARY OF THE INVENTION

According to a first aspect of the present invention there is provided mixed-signal circuitry comprising: analog circuitry having an input for receiving a digital control signal and operable to produce one or more analog signals in dependence upon the received digital control signal; and digital circuitry comprising: a main clocked circuit, clocked by an applied clock signal, and having an output connected operatively to said input of the analog circuitry for applying thereto said digital control signal and operable selectively to cause said digital control signal to change at times determined by said clock signal; a dummy clocked circuit, also clocked by said clock signal, which produces a dummy signal at an output thereof and is operable selectively to cause said dummy signal to change at said times; and control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal.

In such mixed-signal circuitry, data-dependent jitter can be reduced significantly.

According to a second aspect of the present invention there is provided digital-to-analog conversion circuitry comprising mixed-signal circuitry which comprises: analog circuitry having an input for receiving a digital control signal and operable to produce one or more analog signals in dependence upon the received digital control signal; and digital circuitry comprising: a main clocked circuit, clocked by an applied clock signal, and having an output connected operatively to said input of the analog circuitry for applying thereto said digital control signal and operable selectively to cause said digital control signal to change at times determined by said clock signal; a dummy clocked circuit, also clocked by said clock signal, which produces a dummy signal at an output thereof and is operable selectively to cause said dummy signal to change at said times; and control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal.

According to a third aspect of the present invention there is provided digital-to-analog conversion circuitry comprising mixed-signal circuitry which comprises: analog circuitry having an input for receiving a digital control signal and operable to produce one or more analog signals in dependence upon the received digital control signal; and digital circuitry comprising: a main clocked circuit, clocked by an applied clock signal, and having an output connected operatively to said input of the analog circuitry for applying thereto said digital control signal and operable selectively to cause said digital control signal to change at times determined by said clock signal; a dummy clocked circuit, also clocked by said clock signal, which produces a dummy signal at an output thereof and is operable selectively to cause said dummy signal to change at said times; and control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal, wherein: said analog circuitry has a plurality of such inputs for receiving respective such digital control signals and is operable to produce its said one or more analog signals in dependence upon the received digital control signals; said digital circuitry comprises a pair of clocked circuits for each said input of the analog circuitry, one clocked circuit of said pair being such a main clocked circuit and the other clocked circuit of the pair being such a dummy clocked circuit; said main clocked circuit of each pair is clocked by said clock signal, and has an output connected operatively to one of said inputs of said analog circuitry for applying one of said digital control signals thereto, and is operable selectively to cause that digital control signal to change at said times; said dummy clocked element of each pair is also clocked by the clock signal, and serves to produce a dummy signal at an output thereof, and is operable selectively to cause that dummy signal to change at said times; and said control circuitry is connected with both clocked circuits of each pair and are operable at one of said times at which no change occurs in said digital control signal of the pair to cause such a change to occur in said dummy signal of the pair, and are also operable at one of said times at which there is such a change in said digital control signal of the pair to prevent such a change from occurring in said dummy signal of the pair, and wherein said analog circuitry comprises a plurality of circuitry segments corresponding respectively to said inputs of the analog circuitry, each segment comprising a current source or current sink circuit, and the or each said analog signal is derived by summing the respective currents sourced, or sunk as the case may be, by the current source/sink circuits of selected ones of said circuitry segments of the analog circuitry, the selection of the circuitry segments being determined by said digital control signals.

DETAILED DESCRIPTION OF THE PREFERRED EMBODIMENTS

Figure 3:
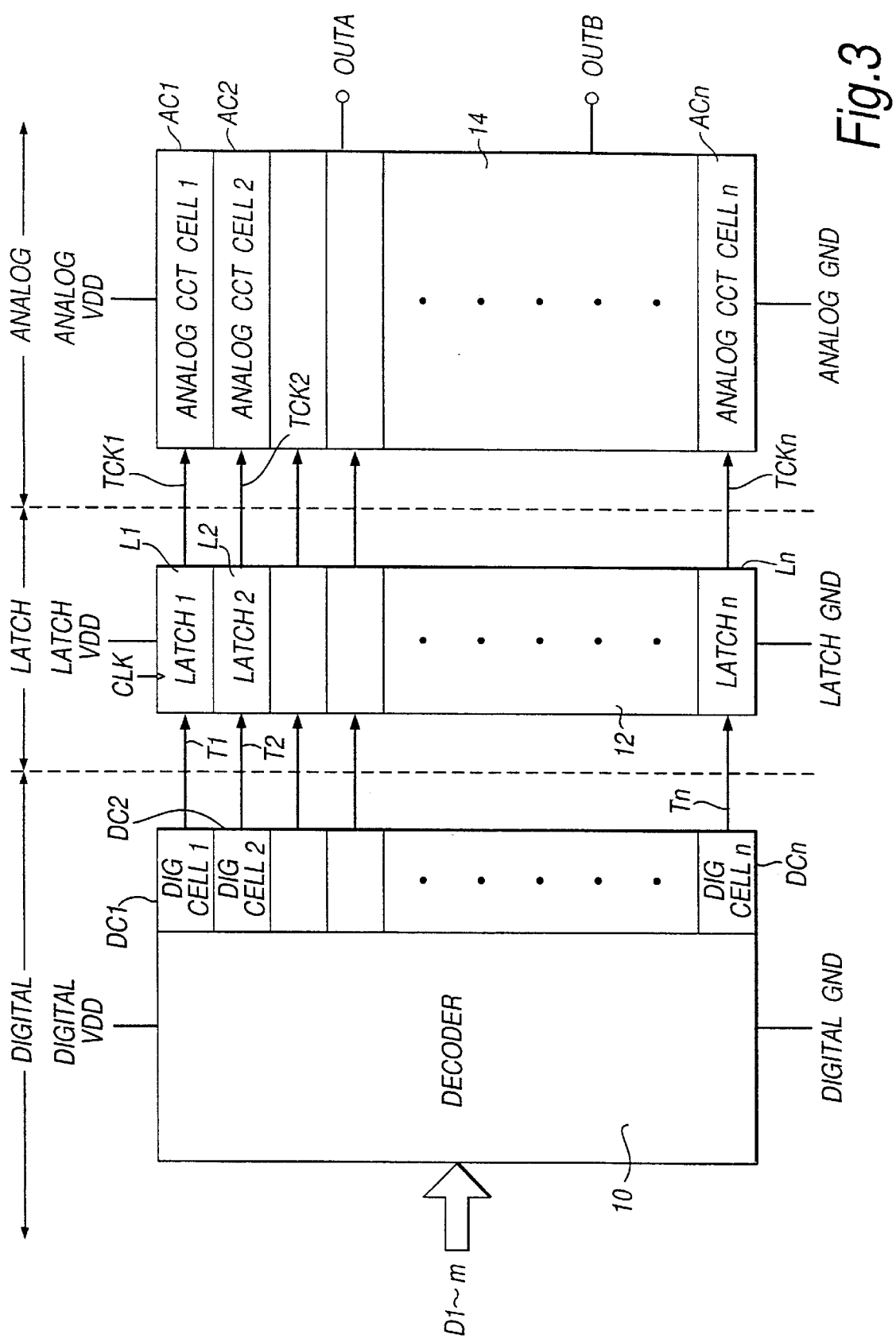
FIG. 3 shows parts of a DAC to which signal control circuitry embodying the present invention is applicable.

FIG. 3 shows parts of a DAC to which signal control circuitry embodying the present invention is applicable. The FIG. 3 circuitry is divided into three sections: a digital section, a latch section and an analog section. The latch section is interposed between the digital and analog sections.

Figures 1, 2:
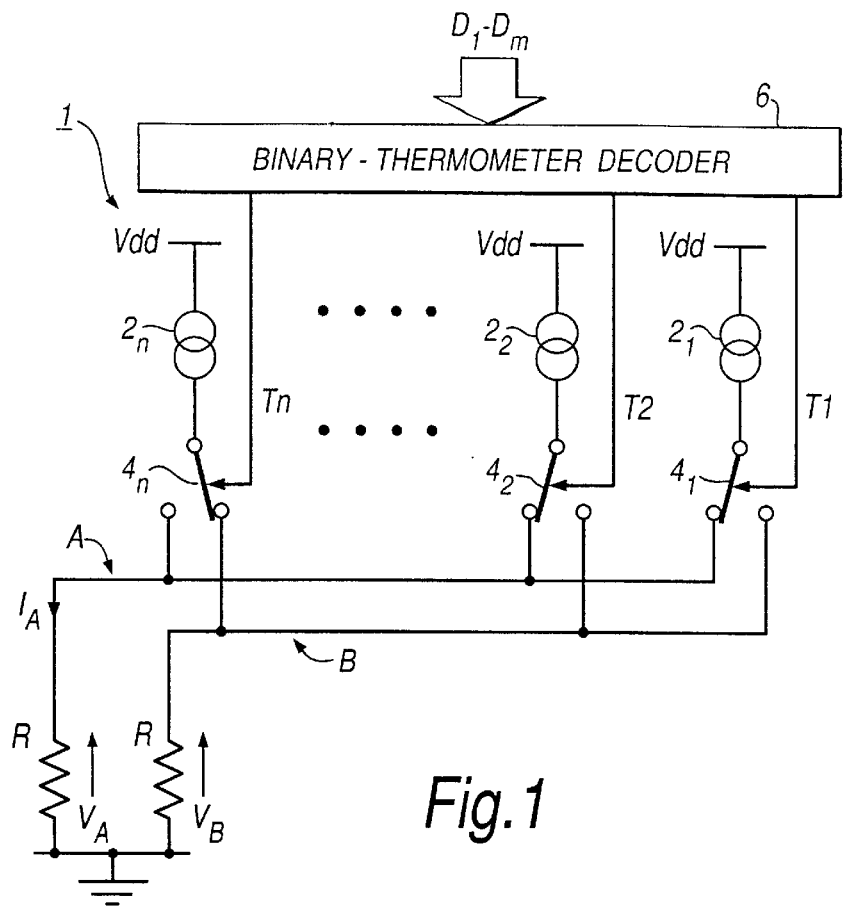
FIG. 1, discussed hereinbefore, shows parts of a conventional DAC.
FIG. 2, also discussed hereinbefore, presents a table showing thermometer-coded signals derived from a binary input word.

The digital section comprises decoder circuitry which is connected other digital circuitry (not shown) to receive an rn-bit digital input word D1~Dm, The decoder circuitry 10 has an output stage made up of n digital circuits DC1 to DCn which produce respectively thermometer-coded signals T1 to Tn based on the digital input word, for example in accordance with the table of FIG. 2 discussed hereinbefore.

In a previously-considered design of the DAC the latch section comprises a set 12 of n latch circuits L1 to Ln. Each latch circuit is connected to receive an individually-corresponding one of the thermometer-coded signals T1 to Tn produced by the decoder circuitry 10. Each latch circuit L1 to Ln also receives a clock signal CLK. The latch circuits L1 to Ln produce at is their outputs respective clocked thermometer signals TCK1 to TCKn that correspond respectively to the thermometer-coded signals T1 to Tn produced by the decoder circuitry 10.

In each cycle of the DAC a new sample of the digital input word D1~Dm is taken and so the thermometer-coded signals T1 to Tn normally change from one cycle to the next. In each cycle, it inevitably takes a finite time for these signals to settle to their intended final values from the moment the new sample is taken. Also, inevitably some digital circuits DC1 to DCn will produce their respective thermometer-coded signals earlier than others. By virtue of the clocked operation of the latch circuits L1 to Ln, the clocked thermometer signals TCK1 to TCKn can be prevented from changing until all the thermometer-coded signals T1 to Tn have settled to their intended values for a particular cycle of the DAC.

The analog section comprises a set 14 of n analog circuits AC1 to ACn. Each of the analog circuits AC1 to ACn receives an individually-corresponding one of the clocked thermometer signals TCK1 to TCKn. The analog circuits AC1 to ACn each have one or more analog output terminals and signals produced at the analog output terminals are combined appropriately to produce one or more analog output signals. For example, currents may be summed by summing connection lines as in FIG. 1. Two such analog output signals OUTA and OUTB are shown in FIG. 3 by way of example.

In the FIG. 3 circuitry, each digital circuit DC1 to DCn, together with its corresponding latch circuit L1 to Ln and its corresponding analog circuit AC1 to ACn, constitutes a so-called "cell" of the DAC. Thus, each cell includes a digital circuit DC, a latch circuit L and an analog circuit AC. The digital circuit DC produces a first digital signal (thermometer-coded signal) T for its cell. The latch circuit for the cell receives the first digital signal T and delivers to the analog circuit AC of the cell a second digital signal (clocked thermometer signal) TCK corresponding to the first digital signal T once the first digital signals of all cells have settled to their final intended values. Thus, the latch circuit serves as a signal control circuit for deriving the second digital signal from the first digital signal and controlling the timing of its application to the analog circuit AC. The second digital signal TCK serves as a control signal for use in controlling a predetermined operation of the analog circuit AC of the cell. This predetermined operation may be any suitable type of operation of the cell. For example, it could be a switching or selection operation for switching on or off, or controlling the output path of, an analog output signal of the cell. An example of the analog circuit AC of a cell is given later with reference to FIG. 4B.

Figure 4A:
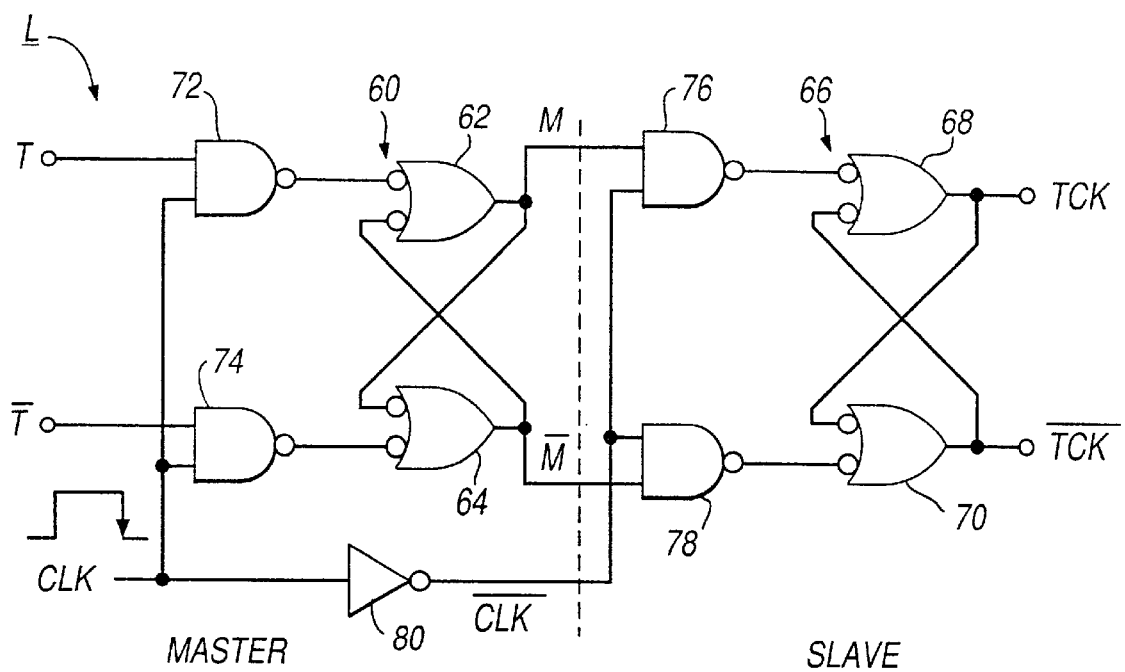
FIG. 4A shows a circuit diagram of a latch circuit suitable for use in the FIG. 3 DAC.
Figure 4B:
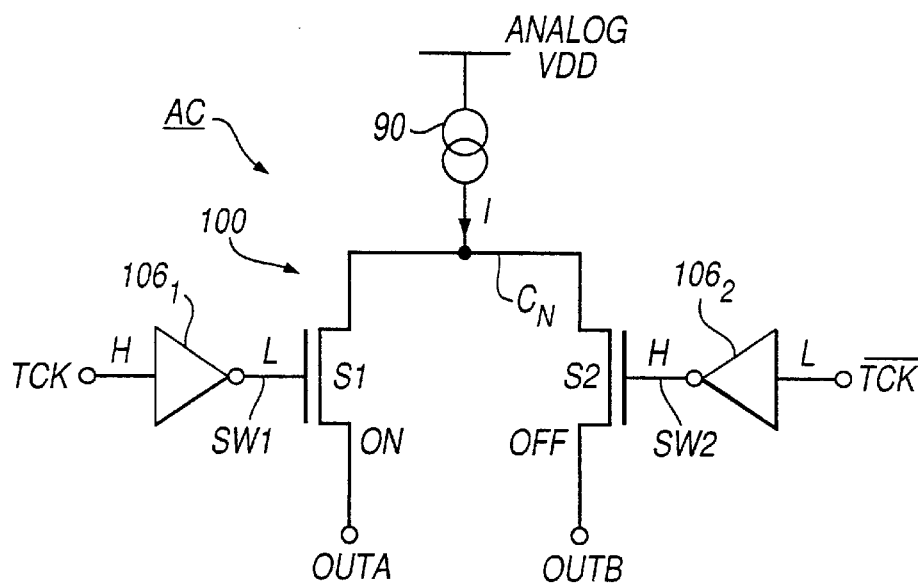
FIG. 4B shows a circuit diagram of an analog circuit suitable for use in the FIG. 3 DAC.

FIGS. 4A and 4B show respectively examples of the construction of the latch circuit L and analog circuit AC of one cell of the FIG. 3 circuitry.

The latch circuit L of FIG. 4A is of the differential D-type having (in this example) a master-slave configuration. The FIG. 4A circuit has a master flip-flop 60 made up of NAND gates 62 and 64, and a slave flip-flop 66 made up of NAND gates 68 and 70. NAND gates 72 and 74 each receive at one input thereof a clock signal CLK (FIG. 3). The other inputs of the gates 72 and 74 are connected respectively to T and $\overline{T}$ inputs of the circuit. The T input receives the thermometer-coded signal T produced by the digital circuit DC of the cell concerned. The $\overline{T}$ input is connected to receive a signal $\overline{T}$ complementary to the thermometer-coded signal. Complementary signals T and $\overline{T}$ are used in this embodiment since any change in the signal T is accompanied by a complementary change in the signal $\overline{T}$, which reduces the noise imposed on the power supply lines when the input word changes. If desired, however, the FIG. 4A circuit could be modified to have a single T input, in which case an additional inverter (not shown) would be provided between that single input and the relevant input of the gate 74.

The FIG. 4A circuit also includes NAND gates 76 and 78 connected between outputs M and $\overline{M}$ of the master flip-flop 60 and inputs of the slave flip-flop 66. These gates 76 and 78 receive an inverted version $\overline{CLK}$ of the clock signal CLK produced by an inverter 80. Outputs of the slave flip-flop produce respectively mutually-complementary output signals TCK and $\overline{TCK}$.

In use of the FIG. 4A circuit, when the clock signal CLK is high, the gates 72 and 74 are enabled, forcing the outputs M and $\overline{M}$ of the master flip-flop 60 to the same logic values as the inputs T and $\overline{T}$ respectively, i.e. M=T and $\overline{M}=\overline{T}$. The gates 76 and 78 are disabled, so the slave flip-flop 66 retains its previous state. When the clock signal CLK changes from HIGH to LOW, the inputs to the master flip-flop 60 are disconnected from the T and $\overline{T}$ input signals, whereas the inputs of the slave flip-flop 66 are simultaneously coupled to the outputs M and $\overline{M}$ of the master flip-flop 60. The master flip-flop 60 accordingly transfers its state to the slave flip-flop 66. No further changes can occur in the output signals TCK and $\overline{TCK}$ because the master flip-flop 60 is now effectively disabled. At the next rising edge of the clock signal CLK, the slave flip-flop 66 is decoupled from the master flip-flop 60 and retains its state, whilst the master flip-flop 60 once again follows the input signals T and $\overline{T}$.

FIG. 4B shows parts of an exemplary analog circuit AC of one cell of the FIG. 3 circuitry. The analog circuit AC comprises a constant-current source 90 and a differential switching circuit 100. The differential switching circuit 100 comprises first and second PMOS field-effect-transistors (FETs) S1 and S2. The respective sources of the transistors S1 and S2 are connected to a common node CN to which the current source 90 is also connected. The respective drains of the transistors S1 and S2 are connected to respective first and second summing output terminals OUTA and OUTB of the circuit. In this embodiment, the output terminals OUTA of all cells are connected together and the respective output terminals OUTB of the cells are connected together.

Each transistor S1 and S2 has a corresponding driver circuit $106_1$ and $106_2$ connected to its gate. The clocked thermometer signals TCK and $\overline{TCK}$ produced by the latch circuit L of the cell (e.g. FIG. 4A) are applied respectively to inputs of the driver circuits $106_1$, and $106_2$. Each driver circuit buffers and inverts its received input signal TCK or $\overline{TCK}$ to produce a switching signal SW1 or SW2 for its associated transistor S1 or S2 such that, in the steady-state condition, one of the transistors S1 and S2 is on and the other is off. For example, as indicated in FIG. 2 itself, when the input signal TCK has the high level (H) and the input signal $\overline{TCK}$ has the low level (L), the switching signal SW1 (gate drive voltage) for the transistor S1 is at the low level L causing that transistor be ON, whereas the switching signal SW2 (gate drive voltage) for the transistor S2 is at the high level H, causing that transistor to be OFF. Thus, in this condition, all of the current I flowing into the common node CN is passed to the first output terminal OUTA and no current passes to the second output terminal OUTB.

When the input signals TCK and $\overline{\text{TCK}}$ undergo complementary changes from the state shown in FIG. 4B, the transistor S1 turns OFF at the same time that the transistor S2 turns ON.

As far as the digital circuits are concerned, any suitable binary-thermometer decoding circuitry can be used. A two-stage decoding process may be used in which a so-called global decoder decodes the input word into two or more sets (or dimensions) of thermometer-coded signals (referred to as row and column signals or row, column and depth signals). These two or more sets of signals are delivered to a plurality of local decoders which correspond respectively to the cells. Each local decoder only needs to receive and decode a small number (e.g. two or three) of the signals in the sets produced by the global decoder. These local decoders can be regarded as being arranged logically (not necessarily physically as well) in two or more dimensions corresponding respectively to the sets of thermometer-coded signals. The local decoders are addressed by the sets of the thermometer-coded signals and, using simple combinatorial logic, derive respective "local" thermometer-coded signals for their respective cells. The digital circuits DC1 to DCn in FIG. 3 may, for example, consist only of respective such local decoders, the global decoder being external to these digital circuits DC1 to DCn. Further details of two-stage thermometer-decoding may be found, for example, in our co-pending U.S. patent application Ser. No. 09/227200 (corresponding to United Kingdom patent publication no. GB-A-2333171), the entire content of which is incorporated herein by reference.

Other features and modifications of the FIG. 3 circuitry are described in more detail in our co-pending U.S. patent application Ser. No. 09/227201 (corresponding to United Kingdom patent publication no. GB-A-2335097), the entire content of which is incorporated herein by reference.

Figure 5:
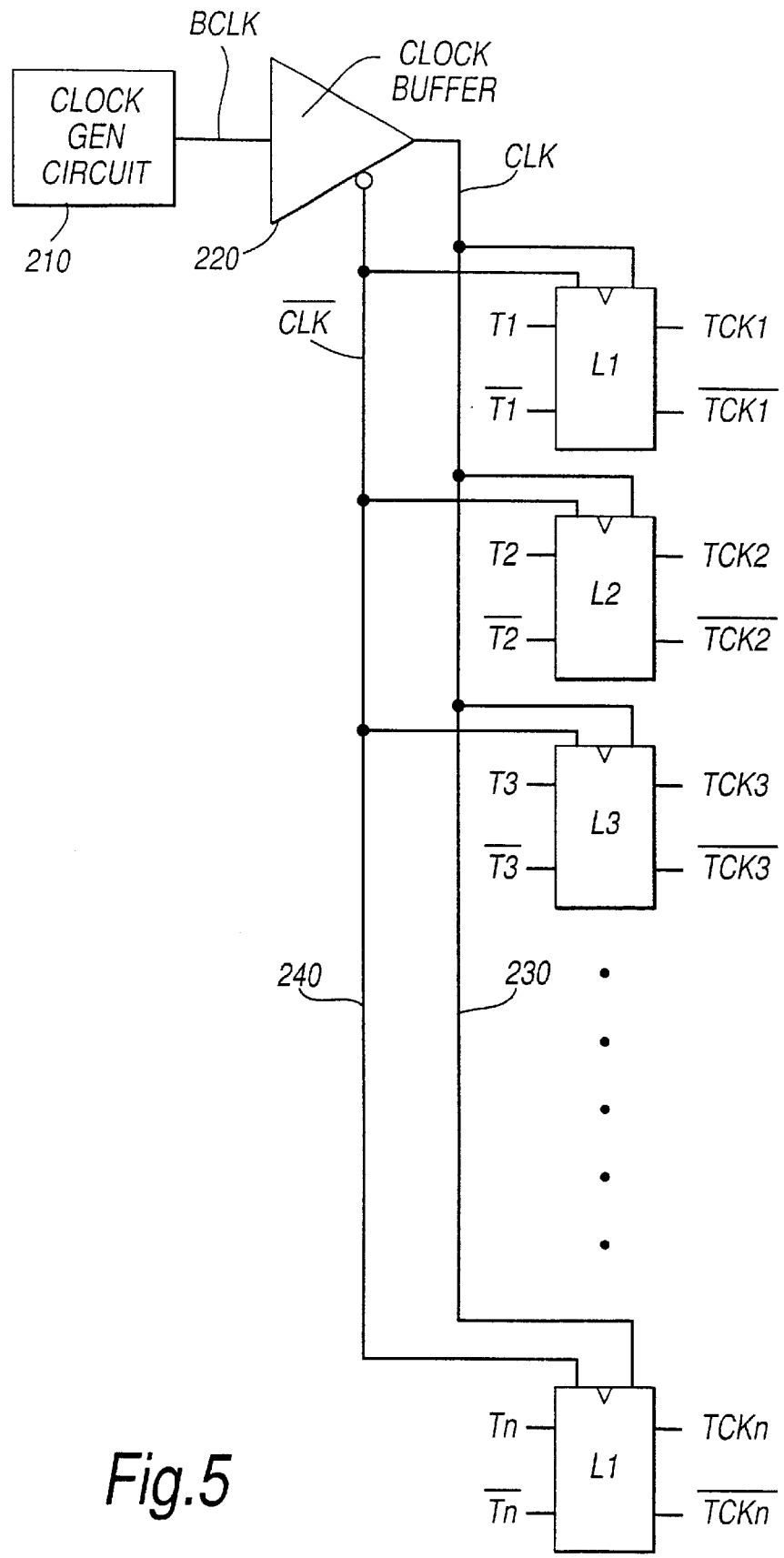
FIG. 5 shows a block circuit diagram of signal control circuitry previously considered for use in a DAC.

FIG. 5 is a block circuit diagram showing one previously-considered implementation of the latch section of the FIG. 3 circuitry. In this implementation, a clock generator circuit 210 is connected to a single clock buffer circuit 220 for applying thereto a basic clock signal BCLK. The clock buffer 220 has respective non-inverting and inverting outputs at which complementary clock signals CLK and $\overline{\text{CLK}}$ are produced when the circuitry is in use.

The non-inverted clock signal CLK may be produced by simply buffering the basic clock signal BCLK, and the inverted clock signal $\overline{\text{CLK}}$ may be produced by inverting and buffering the basic clock signal BCLK. It would also be possible for the clock buffer 220 to have a frequency-dividing function such that, for example, the complementary clock signals CLK and $\overline{\text{CLK}}$ are of half the frequency of the basic clock signal BCLK. In this case, the clock buffer 220 could be implemented by a D-type flip-flop whose inverting output is coupled back to its data input, the basic clock signal BCLK being applied to the clock input of the flip-flop and the required non-inverting and inverting clock signals CLK and $\overline{\text{CLK}}$ being produced at the non-inverting and inverting outputs of the flip-flop respectively.

The complementary clock signals CLK and $\overline{\text{CLK}}$ are distributed via distribution lines 230 and 240 respectively to the clock inputs of the latch circuits L1 to Ln. These latch circuits L1 to Ln can each have the configuration shown in FIG. 4A, except that the inverter 80 shown in FIG. 4A is not required as the inverted clock signal $\overline{\text{CLK}}$ is generated by the clock buffer 220 in this example.

The clock distribution arrangement shown in FIG. 5 does not always operate satisfactorily in demanding applications because data-dependent jitter is present in the output thermometer signals TCK1 to TCKn and $\overline{\text{TCK1}}$ to $\overline{\text{TCKn}}$.

Figure 6:
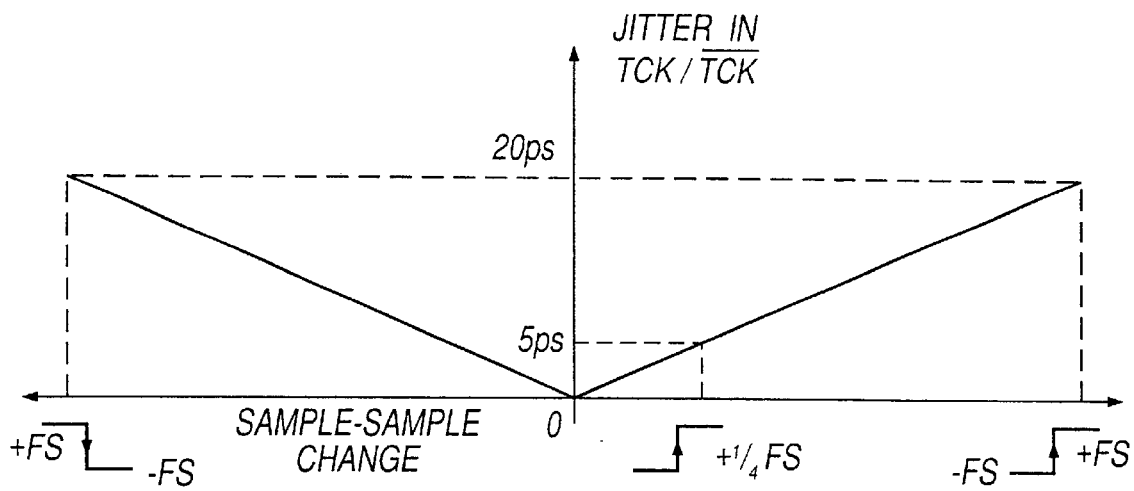
FIG. 6 shows a graph illustrating jitter in the FIG. 5 signal control circuitry.

FIG. 6 shows the variation in the jitter for different sample-sample changes in the input code D1~Dm applied to the decoder 10 in FIG. 3. When the input code is unchanged from one sample to the next (i.e. the input word D1~Dm is the same before and after a cycle of the basic clock signal BCLK), there is negligible jitter in the output thermometer signals TCK, $\overline{\text{TCK}}$. However, when the input word changes from one cycle to the next, it is observed that the amount of jitter increases in approximate proportion to the size of the sample-sample change. The maximum such sample-sample change occurs either when the input word changes from its negative full-scale value −FS to its positive full-scale value +FS or vice versa. In this case, the jitter can be as much as 20 ps. For smaller changes in the input word the jitter is reduced proportionately. For example, when the input word increases by an amount equal to one quarter of the full-scale value FS (e.g. when the input word changes from +½FS to +¾FS) the observed jitter is approximately 5 ps.

One reason for the jitter varying according to the size of the sample-sample change is that the loading of the clock signals CLK and $\overline{\text{CLK}}$ produced by the clock buffer 220 is dependent upon the number of latch circuits L1 to Ln which change their state from one clock cycle to the next. When the input word is the same from one clock cycle to the next, none of the latch circuits changes its state so that the loading on the clock signals CLK and $\overline{\text{CLK}}$ is minimal. When, on the other hand, the input word changes, some of the latch circuits L1 to Ln must change their state from one clock cycle to the next, and the greater the number of latch circuits that change state the greater the loading imposed on the clock signals CLK and $\overline{\text{CLK}}$. Although it might be considered that an adequate solution to this problem would simply be to increase the size of the output transistors in the clock buffer 220, so as to provide a greater load-driving capability, such a solution is not satisfactory in practice. For one thing, the current consumption of the clock buffer 220 is then increased, resulting in the coupling of additional noise into the latch circuit power supplies LATCH VDD and LATCH GND which inevitably cross-couples into the sensitive analog power supplies ANALOG VDD and ANALOG GND. Also, as the heavily-loaded distribution lines 230 and 240 are relatively long and accordingly have a relatively high parasitic capacitance, there is inevitably a skewing of the clock signals delivered to the different latch circuits from the clock buffer 220.

Another reason for the jitter varying according to the size of the sample-sample change is that the current drawn by the latch section as a whole varies according to the number of latch circuitry L1 to Ln which change state from one cycle to the next. This affects the power supply to the latch section which leads to jitter. In addition, even if a separate power supply is used for the analog section, there is inevitably some cross-coupling from the latch-section power supply to the analog-section power supply which leads to further jitter. For example, when an individual latch circuit changes state at a clock edge the current spike at the edge may be twice as great at when there is no change of state at that edge. When multiple latch circuits are considered, the variation in the total current spike at different clock edges may be as much as 5 mA, i.e. 10 mA when all latch circuits change state at a clock edge and 5 mA when no latch circuits change state at a clock edge.

A preferred solution to the jitter problem described with reference to FIGS. 5 and 6 will now be described with reference to FIGS. 7 and 8.

Figure 7:
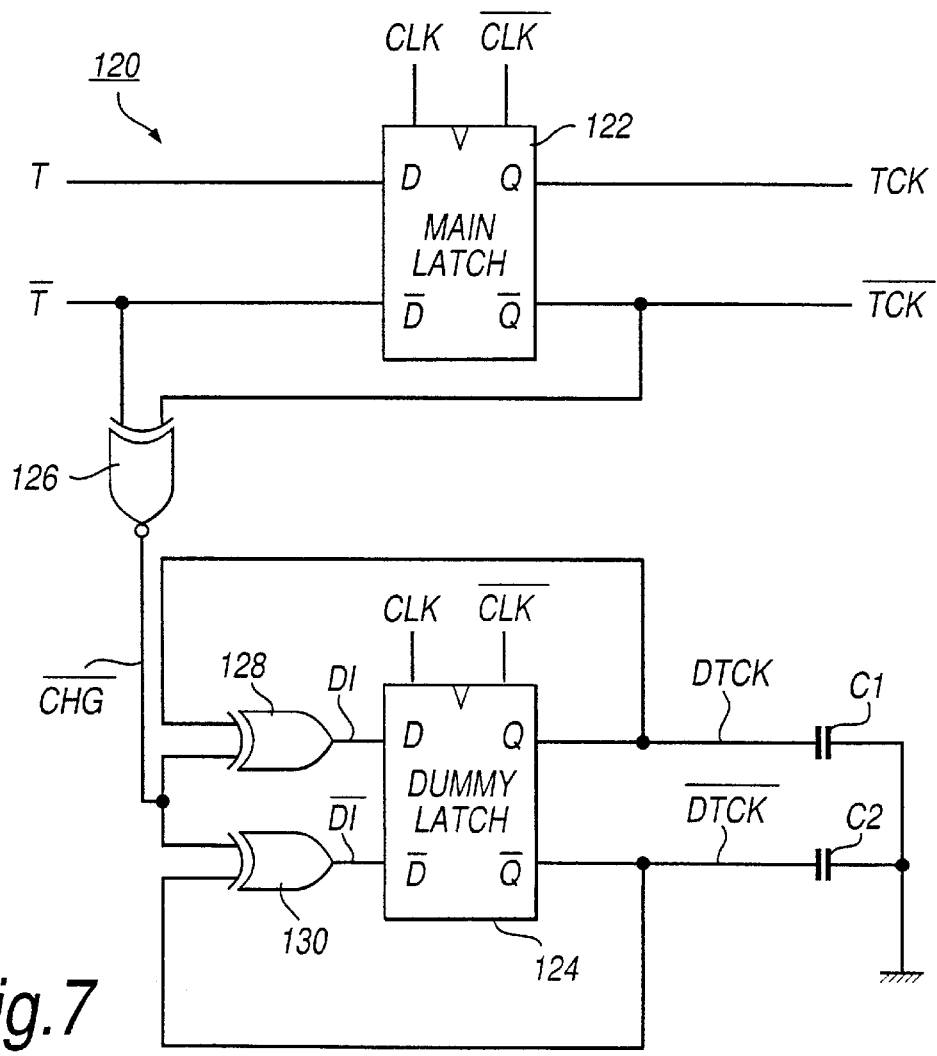
FIG. 7 shows parts of signal control circuitry embodying the present invention.

FIG. 7 shows a signal control circuit 120 which is used in place of each one of the latch circuits L1 to Ln in the signal control circuitry 12 of the FIG. 3 DAC. Thus, there is one such signal control circuit 120 per cell of the DAC.

The signal control circuit 120 comprises a main latch 122 and a dummy latch 124. In this embodiment, each of the latches 122 and 124 is of the differential D-type having a master-slave configuration, as described previously with reference to FIG. 4A.

The main latch 122 receives at its complementary data inputs D and $\overline{D}$ the complementary thermometer-coded signals T and $\overline{T}$ for the cell concerned. The main latch 122 produces at its complementary outputs Q and $\overline{Q}$ respective complementary clocked thermometer-coded signals TCK and $\overline{TCK}$. The main latch 122 receives complementary clocked thermometer-coded signals CLK and $\overline{CLK}$ from clock generating and distributing circuitry (not shown in FIG. 7) such as the clock generator circuit 210 and clock buffer circuit 220 of FIG. 6.

The signal control circuit 120 further includes an exclusive NOR gate 126, respective first and second exclusive OR gates 128 and 130, and first and second capacitors C1 and C2. The exclusive NOR gate 126 receives at its inputs the thermometer-coded signal $\overline{T}$ and the clocked thermometer-coded signal $\overline{TCK}$. An output of the exclusive NOR gate 126 is connected to one input of each of the exclusive OR gates 128 and 130 for applying thereto a change detection signal $\overline{CHG}$. The other input of the first exclusive OR gate 128 is connected to a Q output of the dummy latch 124, and the other input of the second exclusive OR gate 130 is connected to a $\overline{Q}$ output of the dummy latch 124. Mutually-complementary dummy clocked signals DTCK and $\overline{DTCK}$ are generated respectively at the Q and $\overline{Q}$ outputs of the dummy latch 124.

An output of the first exclusive OR gate 128 is connected to a D input of the dummy latch 124 for applying thereto a control signal DI. An output of the second exclusive OR gate 130 is connected to a $\overline{D}$ input of the dummy latch 124 for applying thereto a control signal $\overline{DI}$ complementary to the DI control signal.

The capacitor C1 is connected between the Q output of the dummy latch 124 and GND, and the capacitor C2 is connected between the $\overline{Q}$ output and GND.

Operation of the FIG. 7 signal control circuit will now be described with reference to FIG. 8. In FIG. 8, it is assumed that initially the main latch 122 and the dummy latch 124 are each in a reset condition such that TCK and DTCK are L, and $\overline{TCK}$ and $\overline{DTCK}$ are H. It is also assumed that initially the input signals T and $\overline{T}$ are L and H respectively. In this condition, $\overline{CHG}$ is H and DI and $\overline{DI}$ are H and L respectively.

At the falling edge A of the CLK signal a first operation cycle CYCLE1 begins. At the beginning of CYCLE1, the signals $\overline{T}$ and $\overline{TCK}$ applied to the exclusive NOR gate inputs are the same (H). As a result the change detection signal $\overline{CHG}$ is also H (inactive). The change detection signal $\overline{CHG}$ is an active-low signal which is H when the $\overline{T}$ and $\overline{TCK}$ signals are the same, and L when the $\overline{T}$ and $\overline{TCK}$ signals are different.

Each of the exclusive OR gates 128 and 130 is connected in a feedback loop between one of the outputs Q and $\overline{Q}$ and its associated one of the inputs D or $\overline{D}$ of the dummy latch 124. When the change detection signal $\overline{CHG}$ signal is inactive (H), the effect of the exclusive OR gate in each feedback loop is to make the feedback loop inverting. When the change detection signal $\overline{CHG}$ is active (L), the effect of the exclusive OR gate in each feedback loop is to make the feedback loop non-inverting.

Figure 8:
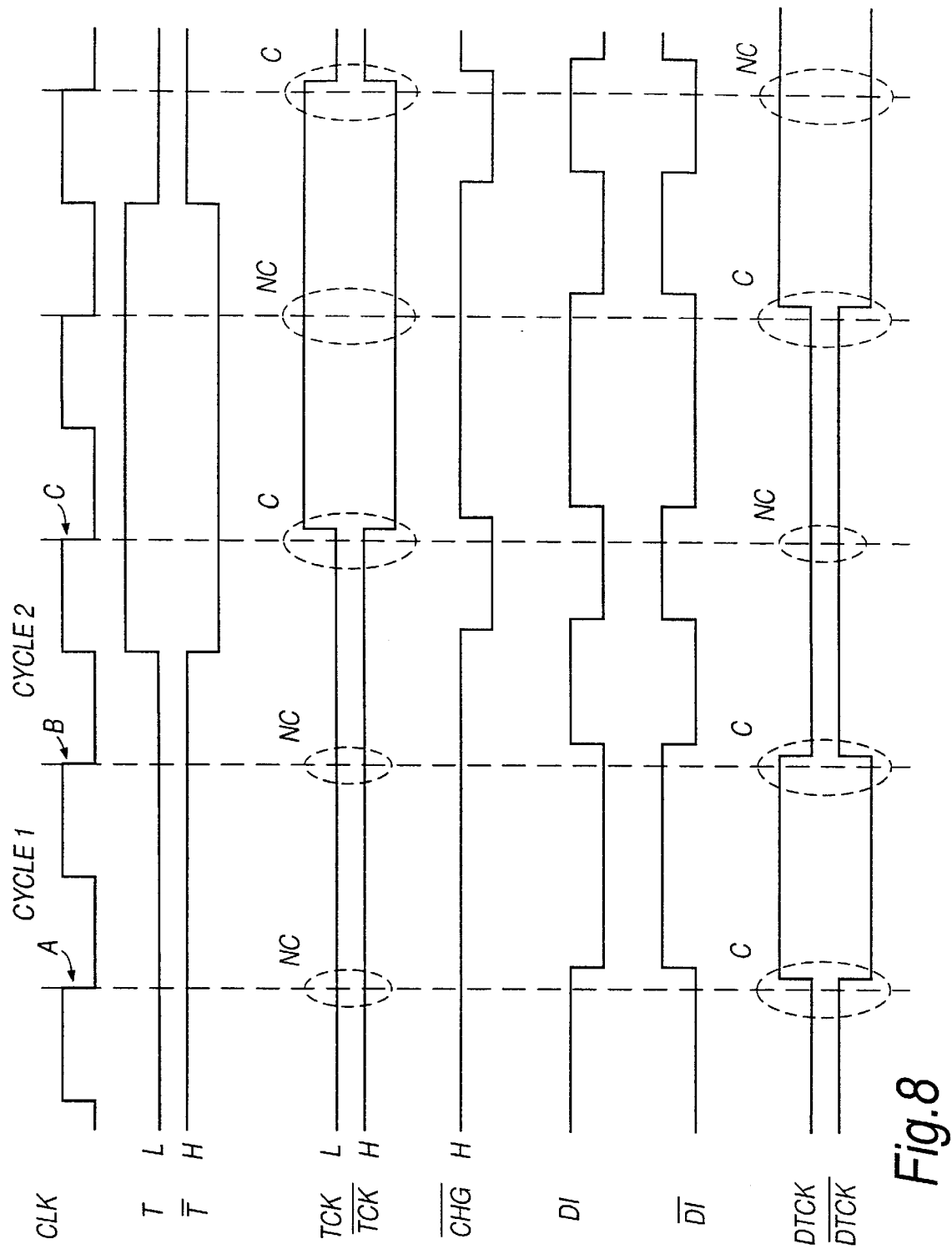
FIG. 8 shows timing diagrams for illustrating operation of the FIG. 7 circuitry.

Accordingly, as shown in FIG. 8, both the feedback loops around the dummy latch 124 are inverting at the falling edge A, because $\overline{CHG}$ is H. This causes the output signals DTCK and $\overline{DTCK}$ of the dummy latch 124 to be inverted in response to the falling edge A. Thus, DTCK changes from L to H a short time after the falling edge A, and $\overline{DTCK}$ changes from H to L a short time after the falling edge A. Accordingly, it can be seen that, although the output signals TCK and $\overline{TCK}$ of the main latch 122 do not change in response to the falling edge A, as indicated by the annotation "NC" on both signals at the falling edge A in FIG. 8, the output signals DTCK and $\overline{DTCK}$ of the dummy latch 124 undergo complementary changes as indicated by the annotation "C" on both signals at the falling edge A in FIG. 8.

Shortly after the complementary changes in the DTCK and $\overline{DTCK}$ signals in CYCLE1, the signals DI and $\overline{DI}$ undergo complementary changes from H to L and L to H respectively, as the feedback loops around the dummy latch 124 are still in the inverting condition ($\overline{CHG}$=H).

In CYCLE1, the T and $\overline{T}$ input signals do not change, so that at the beginning of CYCLE2 (the falling edge B of the CLK signal) $\overline{CHG}$ remains H. For this reason, the signals DI and $\overline{DI}$ at the inputs of the dummy latch 124 are L and H respectively at the falling edge B, so that the output signals DTCK and $\overline{DTCK}$ of the dummy latch 124 are again inverted in response to the falling edge B. Thus, as at the falling edge A, although the TCK and $\overline{TCK}$ output signals of the main latch 122 do not change in response to the falling edge B ("NC" in FIG. 8), the output signals DTCK and $\overline{DTCK}$ of the dummy latch 124 undergo complementary changes ("C" in FIG. 8).

In CYCLE2, the T and $\overline{T}$ input signals undergo complementary changes. This means that, at the beginning of CYCLE3 (the falling edge C in FIG. 8), the output signals TCK and $\overline{TCK}$ of the main latch 122 will undergo complementary changes as indicated by "C" in FIG. 8. In response to the changes in T and $\overline{T}$ the change detection signal $\overline{CHG}$ changes from the inactive state H to the active state L. This means that each feedback loop around the dummy latch 124 is changed from the inverting condition to the non-inverting condition. Accordingly, at the falling edge C, DI=DTCK and $\overline{DI}$ =$\overline{DTCK}$, so the signals DTCK and $\overline{DTCK}$ do not change in response to the falling edge C. Accordingly, although the output signals TCK and $\overline{TCK}$ of the main latch 122 undergo changes in response to the falling edge C ("C" in FIG. 8), the DTCK and $\overline{DTCK}$ output signals of the dummy latch 124 do not change in response to that falling edge, as indicated by "NC" in FIG. 8.

Operation continues in this way for successive cycles, with the output signals DTCK and $\overline{DTCK}$ of the dummy latch being unchanged in response to falling edges of the CLK signal at which the output signals TCK and $\overline{TCK}$ of the main latch change, and DTCK and $\overline{DTCK}$ undergoing complementary changes in response to falling edges at which the TCK and $\overline{TCK}$ output signals of the main latch do not change.

The output signals DTCK and $\overline{DTCK}$ of the dummy latch 124 are connected via the capacitors C1 and C2 to GND. Accordingly, current is only consumed by the capacitors when the output signals DTCK and $\overline{\text{DTCK}}$ of the dummy latch 124 change. In addition to the current which flows into or out of the capacitors C1 and C2 when such changes occur, the dummy latch 124 itself also consumes a current when it changes state, for example due to the charging/discharging of parasitic capacitances associated with the internal transistors and/or temporary current paths created between the power supply lines during switching. The main latch 122 and the dummy latch 124 in this embodiment are constructed identically, so that the current consumed by one of the latches when changing state should be substantially the same as the current consumed by the other latch when changing state. In addition, the capacitors C1 and C2 are chosen so that the currents which flow into/out of the dummy-latch outputs when the dummy latch changes state are substantially the same as the currents which flow into/out of the main-latch outputs from/to the analog circuit AC of the cell (e.g. FIG. 4B) when the main latch changes state. For example, C1 and C2 may have a capacitance of approximately 20 fF (approximately the same capacitance as the inputs of the switch driver circuits $106_1$, and $106_2$ in FIG. 4B).

In this way, it can be ensured that the supply current change at each falling edge of the CLK signal in FIG. 8 is substantially the same, irrespective of whether or not the main-latch output signals TCK and $\overline{\text{TCK}}$ will change in response to that falling edge. Thus, the supply current is no longer data-dependent so that data-dependent jitter arising from the power supplies is reduced significantly.

Incidentally, although the total current consumed by the respective signal control circuits 120 of all the cells in this case is higher than in the FIG. 5 signal control circuitry (except when all of the latch circuits L1 to Ln in FIG. 5 change state together), the increased current consumption is not in itself a problem, as this does not induce jitter. It is the variation in supply current from one cycle to the next that causes the jitter problem. In any event, the signal control circuits can be implemented by using simple digital circuitry having few transistors so that the actual current consumed is quite low. Preferably the signal control circuits are implemented using CMOS transistors to keep the steady-state currents consumed at a very low level.

In the signal control circuit 120 the loading imposed on the clock signals CLK and $\overline{\text{CLK}}$ is also the same whether or not the main-latch output signals TCK and $\overline{\text{TCK}}$ change at the falling edge of CLK. This means that the clock loading is independent of any changes in the data being applied to the analog circuit of the cell. When all of the cells are considered together, this means that the clock loading is independent of changes in the binary input word applied to the DAC from one cycle to the next.

In the FIG. 7 embodiment a reduction in jitter of 80–90% can be achieved compared to the FIG. 5 circuitry, i.e. a factor of 5 to 10 improvement. Overall the data-dependent jitter may be as low as 10 ps.

Figure 9:
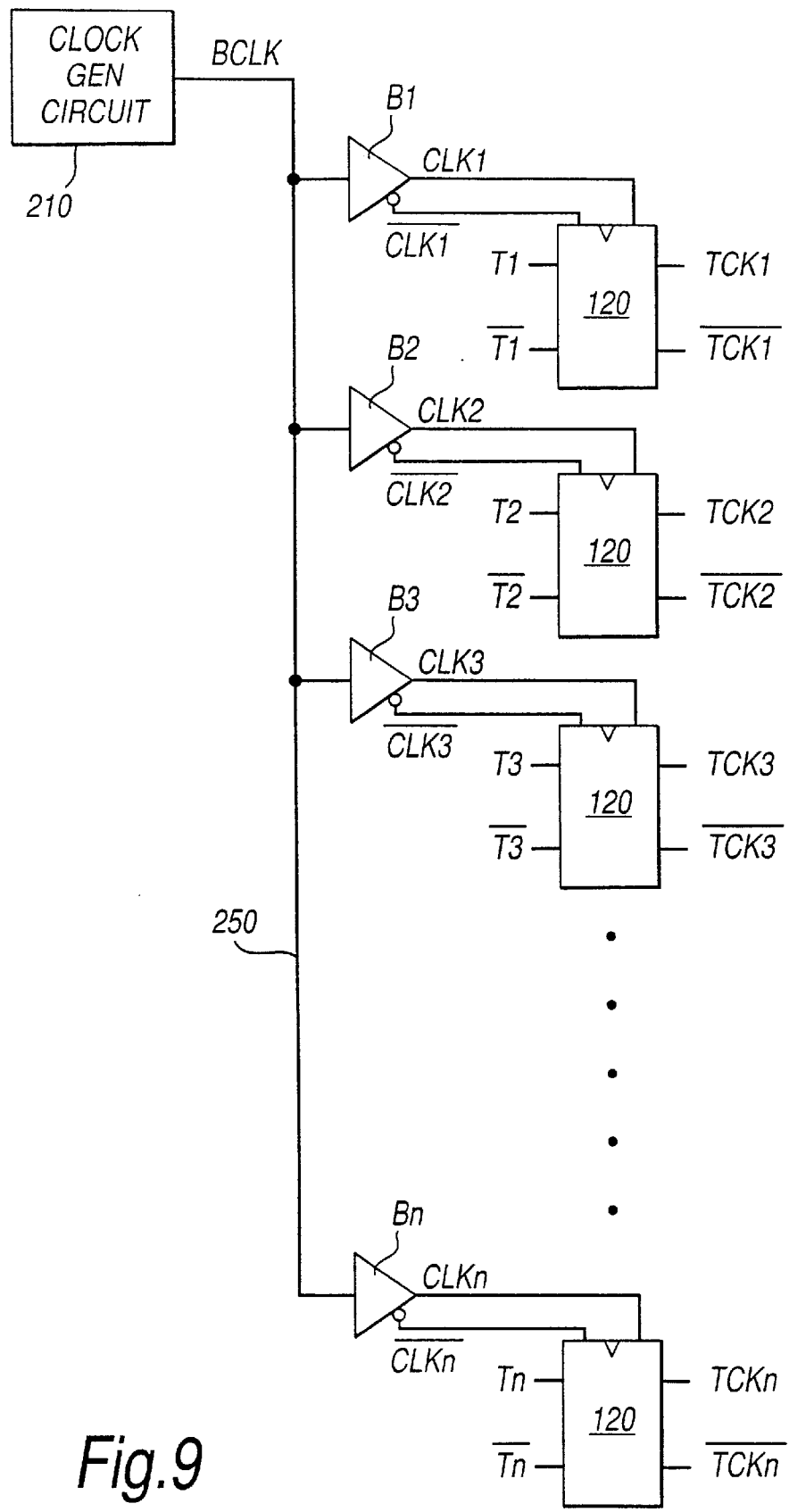
FIG. 9 shows a block circuit diagram of signal control circuitry according to another embodiment of the present invention.

Because the clock loading is data-independent any suitable clock distribution technique can be used. For example, a common clock buffer can be used as in FIG. 5. Alternatively, the signal control circuits 120 can be provided with respective local clock buffers BE to En as shown in FIG. 9. In this case, each clock buffer circuit B1 to Bn only has to drive one signal control circuit 120, so the size of the output transistors thereof can be much smaller in the clock buffer 220 of FIG. 5.

In FIG. 9, because each signal control circuit 120 has its own buffer circuit B1 to Bn interposed between it and the clock generator circuit 210, the clock distribution line 250 which links the clock generator circuit 210 to the buffer circuits B1 to Bn is affected much less by changes in state of the signal control circuits than the corresponding clock distribution lines 230 and 240 in FIG. 5. Accordingly, the amount of jitter is reduced still further.

In FIG. 9 it is also possible to use two clock distribution lines to distribute mutually-complementary basic clock signals BCLK and $\overline{\text{BCLK}}$ to the buffer circuits, in which case each buffer circuit simply has respective inverters for deriving the required complementary "local" clock signals CLK and $\overline{\text{CLK}}$ from the basic clock signals. This has the advantage that the clock distribution lines undergo complementary changes so that the substrate (to which the two clock distribution lines are capacitatively coupled) is affected less by clock-signal changes.

It is not necessary for every signal control circuit to be provided with its own buffer circuit as in FIG. 9. For example, it would be possible for two or more signal control circuits (e.g. two adjacent signal control circuits) to share the same buffer circuit B, enabling the total number of buffer circuits to be reduced.

Figure 10:
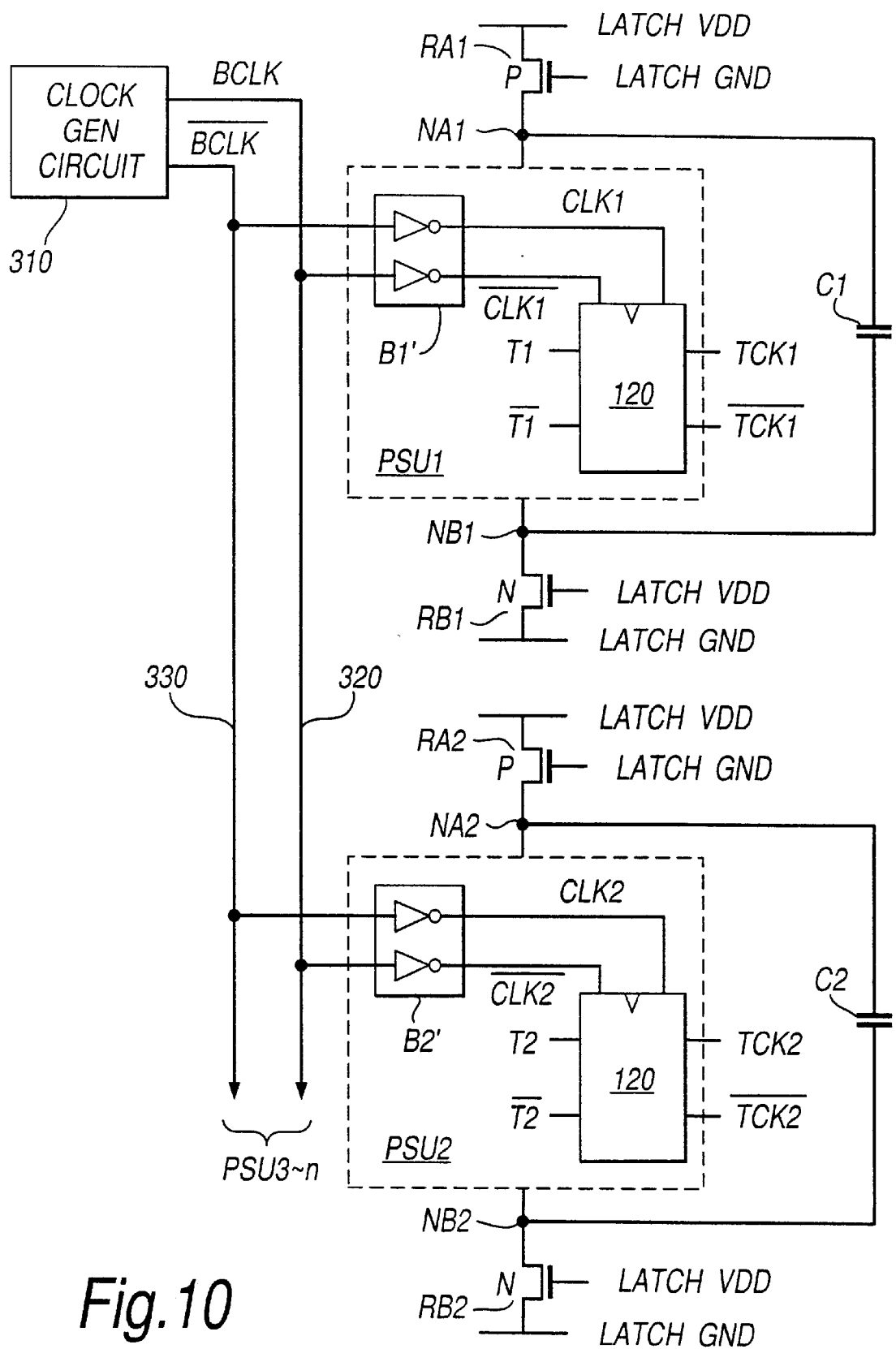
FIG. 10 shows a block circuit diagram of parts of signal control circuitry according to a further embodiment of the present invention.

As described above, the FIG. 7 signal control circuit is effective in making the load on the power supplies of the signal control circuitry independent of the step size from one clock cycle to the next, i.e. independent of the number of main latches 122 which change state from one clock cycle to the next. However, to further reduce power-supply-dependent jitter, as shown in FIG. 10 the signal control circuitry may be divided up into n individual units PSU1 to PSUn for power supply purposes, as described in our co-pending U.S. patent application Ser. No. 09/227201 (corresponding to United Kingdom patent publication no. GB-A-2335097), the entire content of which is incorporated herein by reference. Each unit PSU is made up of a clock buffer circuit B' and a signal control circuit 120.

In this embodiment a clock generator circuit 310 serves to generate mutually-complementary basic clock signals BCLK and $\overline{\text{BCLK}}$ which are distributed by different respective clock distribution lines 320 to 330 to each of the different clock buffer circuits B1' to Bn'. Each clock buffer circuit B' accordingly comprises two inverters for producing the required "local" mutually-complementary clock signals for application to its associated signal control circuit 120.

In the FIG. 10 embodiment, the VDD and GND supplies for the different units PSU1 to PSUn are decoupled from one another using first and second resistors RA and RB and a capacitor C. The resistor RA connects a first power supply node NA of its unit PSU to a main positive supply line LATCH VDD of the signal control circuitry. This first power supply node NA is connected within the unit PSU to the VDD connection terminals of the clock buffer circuit B' and the signal control circuit 120 of that unit. Similarly, the resistor RB connects a second power supply node NB of its unit PSU to a main electrical ground line LATCH GND of the signal control circuitry. This second power supply node NB is connected within the unit PSU to the GND connection terminals of the buffer circuit B' and the signal control circuit 120 of the unit PSU concerned. The capacitor C is connected between the two nodes NA and NB.

In this embodiment, as shown in FIG. 10 itself the resistor RA is constituted by a PMOS transistor whose source is connected to the main positive supply line LATCH VDD and whose drain is connected to the node NA. The gate of the PMOS transistor is connected to LATCH GND. The resistor RB is formed by an NMOS transistor whose source is connected to the main electrical ground line LATCH GND and whose drain is connected to the node NB. The gate of the NMOS transistor is connected to LATCH VDD. The reason for connecting the transistor gates to LATCH GND and LATCH VDD respectively is to cause the resistances of the transistors to track changes in the power supply voltages LATCH VDD and LATCH GND. If the potential difference between these two supply lines increases, the transistors turn on more strongly, reducing their respective resistances.

It is preferable to match the sizes of the transistors used to provide the resistors RA and RB to the sizes of the transistors included in the circuitry (i.e. the buffer circuit B' and signal control circuit 120) of an individual one of the units PSU. For example, the size of each of the transistors used to provide RA and RB may be made equal to the total size of the transistors in the buffer circuit and signal control circuit of an individual unit PSU.

The power supply decoupling idea described above with reference to FIG. 10 can also be applied advantageously when the clock distribution arrangement is as shown in FIG. 5. In this case, as the different signal control circuits do not have respective clock buffer circuits, each individual unit PSU for power supply purposes is constituted simply by one of the signal control circuits 120 alone. Similarly, when two or more signal control circuits share the same clock buffer circuit (a further possibility mentioned above) a unit PSU for power supply purposes could be formed by those two or more signal control circuits together with the common buffer circuit which applies clock signals to those signal control circuits.

It is not essential in any of the foregoing embodiments that the digital circuitry (10 in FIG. 3) produces thermometer-coded signals. The analog circuits could, for example, be selected individually in accordance with the digital control signals produced by the digital circuitry, rather than combinatorially as in the case in which thermometer-coded signals are used. Thus, the digital control signals produced by the digital circuitry could be mutually-exclusive selection signals.

The measures described in relation to the foregoing embodiments are applicable in any situation in which sensitive analog circuits must be capable of undergoing respective predetermined operations at a single well-defined instant in time, or even at respective staggered (but well-defined) instants in time.

In signal control circuitry embodying the present invention, instead of using capacitors C1 and C2 it is possible to provide a dummy analog circuit at the outputs of the dummy latch, so that the currents which flow into/out of the dummy-latch outputs are even more closely matched with the currents that flow into/out of the main-latch outputs. It is not necessary that the entire circuitry of the analog circuit be duplicated for the dummy analog circuit. For example, just the switch drivers ($106_1$, and $106_2$) in FIG. 4B could be provided, the remaining parts being omitted.

It will be appreciated that many other designs of analog circuit can be used. For example, other differential switching circuits are described in our U.S. Pat. No. 6,100,830 (corresponding to United Kingdom patent publication no. GB-A-2333191), the entire content of which is incorporated herein by reference, and other cell arrays for use in DACs and other mixed-signal circuitry are described in our co-pending U.S. patent application Ser. No. 09/137837 (corresponding to United Kingdom patent publication no. GB-A-2333190), the entire content of which is incorporated herein by reference.

Although the main and dummy latches used in the FIG. 7 embodiment were complementary full D-type latches, it will be appreciated that any inevitable type of latch can be used, for example a transparent or half latch.

Although in the foregoing embodiments the signal control circuitry connecting the digital circuitry to the analog circuitry has been made up of latch circuits, this is not essential. Any signal control circuitry can be used so long as it is capable of generating and applying to the input(s) of the analog circuitry at least one digital control signal such that the timing of application of the or each digital control signal to the analog circuitry input is well controlled. The input signals and output signals of the signal control circuitry need not be equal in number. For example, the signal control circuitry could have a combinatorial logic function for combining two or more input digital signals to produce one output signal (digital control signal). Nor need it necessarily be the case that the digital control signals be applied simultaneously to the different analog-circuitry inputs. In some situations a staggered application of the digital control signals might be required, the times when the different digital control signals are applied to their respective inputs nonetheless requiring careful control.

The signal control circuitry need not even have any input data signals at all. For example, the signal control circuitry could be made up of a plurality of individual counters which are incremented at each or at each selected operation cycle, the counter outputs providing the digital control signals.

Furthermore, the signal control circuitry could include multiplexer elements connected between the outputs of the main latches in the signal control circuits and the analog-circuitry inputs, as described for example in our co-pending United Kingdom patent application No. 9926648.8, the entire content of which is incorporated herein by reference.

It is not essential for the signal control circuit of FIG. 7 to cause its dummy latch to change state every time (clock edge) the main latch remains in the same state, and vice versa. The FIG. 7 signal control circuit could be configurated only to cause its dummy latch to change state at certain times (clock edges) when the main latch remains in the same state. For example, the dummy latch changes could be inhibited by an external control signal (to keep power consumption down when jitter is not at a critical level) or whenever the main latch is in a certain state (e.g. TCK=L and $\overline{TCK}$=H).

In the FIG. 7 signal control circuit, instead of having a second feedback path from the $\overline{Q}$ output to the $\overline{D}$ input of the dummy latch it would be possible to use an inverter to produce the $\overline{DI}$ signal from the DI signal. Also, depending on the type of latch, it may be possible to simply leave the $\overline{D}$ input of the dummy latch in an open circuit condition.

What is claimed is:

1. Mixed-signal circuitry comprising:
   analog circuitry having an input for receiving a digital control signal and operable to produce one or more analog signals in dependence upon the received digital control signal; and
   digital circuitry comprising:
   a main clocked circuit, clocked by an applied clock signal, and having an output connected operatively to said input of the analog circuitry for applying thereto said digital control signal and operable selectively to cause said digital control signal to change at times determined by said clock signal;
   a dummy clocked circuit, also clocked by said clock signal, which produces a dummy signal at an output thereof and is operable selectively to cause said dummy signal to change at said times; and control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal.

2. Circuitry as claimed in claim 1, wherein said control circuitry is operable at every one of said times at which no change occurs in said digital control signal to cause such a change to occur in said dummy signal, and are also operable at every one of said times at which there is such a change in said digital control signal to prevent such a change from occurring in said dummy signal.

3. Circuitry as claimed in claim 1, further comprising load circuitry connected operatively with said output of the dummy clocked circuit and having a load characteristic that approximates to a load characteristic of said analog circuitry that is connected to said output of the main clocked circuit.

4. Circuitry as claimed in claim 3, wherein said load circuitry comprises a capacitance element connected to said output of said dummy clocked circuit.

5. Circuitry as claimed in claim 1, wherein said analog circuitry comprises a main analog circuit to which said digital control signal is applied, and a dummy analog circuit to which said dummy signal is applied, said dummy analog circuit having at least one circuitry portion of the same or similar design to said main analog circuit.

6. Circuitry as claimed in claim 1, wherein said dummy clocked circuit has at least one circuitry portion of the same or similar design to said main clocked circuit.

7. Circuitry as claimed in claim 1, wherein said dummy clocked circuit has substantially the same circuit configuration as the same main clocked circuit.

8. Circuitry as claimed in claim 1, wherein:
each said clocked circuit also has an input for receiving an input signal, and said main clocked circuit is operable to change said digital control signal produced at its said output in dependence upon a change in its received input signal, and said dummy clocked circuit is operable to change said dummy signal produced at its said output in dependence upon a change in its received input signal; and
said control circuitry comprises:
change detection circuitry connected with said main clocked circuit and operable to detect when said input signal of the main clocked circuit changes; and
dummy clocked circuit change circuitry operable to change said input signal of said dummy clocked circuit prior to one of said times when no change of said input signal of the main clocked circuit is detected by said change detection circuitry prior to that time, so that said dummy signal changes at that time.

9. Circuitry as claimed in claim 8, wherein:
each said clocked circuit comprises a latch element;
said change detection circuitry is operable to compare an output signal of the latch element of the main clocked circuit with an input signal of that latch element and to produce a change detection signal in dependence upon the result of the comparison; and
the dummy clocked circuit change circuitry comprises feedback circuitry connected for providing a feedback path from an output of the latch element of the dummy clocked circuit to an input of that latch element, which feedback path is changed from an inverting state to a non-inverting state in dependence upon said change detection signal.

10. Circuitry as claimed in claim 9, wherein said change detection circuitry and said feedback circuitry each comprise an exclusive OR gate or an exclusive NOR gate.

11. Circuitry as claimed in claim 1, wherein:
said analog circuitry has a plurality of such inputs for receiving respective such digital control signals and is operable to produce its said one or more analog signals in dependence upon the received digital control signals;
said digital circuitry comprises a pair of clocked circuits for each said input of the analog circuitry, one clocked circuit of said pair being such a main clocked circuit and the other clocked circuit of the pair being such a dummy clocked circuit;
said main clocked circuit of each pair is clocked by said clock signal, and has an output connected operatively to one of said inputs of said analog circuitry for applying one of said digital control signals thereto, and is operable selectively to cause that digital control signal to change at said times;
said dummy clocked element of each pair is also clocked by the clock signal, and serves to produce a dummy signal at an output thereof, and is operable selectively to cause that dummy signal to change at said times; and
said control circuitry is connected with both clocked circuits of each pair and are operable at one of said times at which no change occurs in said digital control signal of the pair to cause such a change to occur in said dummy signal of the pair, and are also operable at one of said times at which there is such a change in said digital control signal of the pair to prevent such a change from occurring in said dummy signal of the pair.

12. Circuitry as claimed in claim 11, wherein said digital circuitry further comprises decoder circuitry connected for receiving a digital input word and operable to derive therefrom a set of decoded signals for application respectively to said main clocked circuits.

13. Circuitry as claimed in claim 11, wherein said digital control signals are thermometer-coded signals.

14. Circuitry as claimed in claim 1, wherein the or each said digital control signal is a complementary signal pair.

15. Digital-to-analog conversion circuitry comprising mixed-signal circuitry which comprises:
analog circuitry having an input for receiving a digital control signal and operable to produce one or more analog signals in dependence upon the received digital control signal; and
digital circuitry comprising:
a main clocked circuit, clocked by an applied clock signal, and having an output connected operatively to said input of the analog circuitry for applying thereto said digital control signal and operable selectively to cause said digital control signal to change at times determined by said clock signal;
a dummy clocked circuit, also clocked by said clock signal, which produces a dummy signal at an output thereof and is operable selectively to cause said dummy signal to change at said times; and
control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal.

16. Digital-to-analog conversion circuitry comprising mixed-signal circuitry which comprises:

analog circuitry having an input for receiving a digital control signal and operable to produce one or more analog signals in dependence upon the received digital control signal; and digital circuitry comprising:

a main clocked circuit, clocked by an applied clock signal, and having an output connected operatively to said input of the analog circuitry for applying thereto said digital control signal and operable selectively to cause said digital control signal to change at times determined by said clock signal;

a dummy clocked circuit, also clocked by said clock signal, which produces a dummy signal at an output thereof and is operable selectively to cause said dummy signal to change at said times; and control circuitry connected with both said clocked circuits and operable at one of said times at which no change occurs in said digital control signal to cause such a change to occur in said dummy signal, and also operable at one of said times at which there is such a change in said digital control signal to prevent such a change from occurring in said dummy signal, wherein:

said analog circuitry has a plurality of such inputs for receiving respective such digital control signals and is operable to produce its said one or more analog signals in dependence upon the received digital control signals;

said digital circuitry comprises a pair of clocked circuits for each said input of the analog circuitry, one clocked circuit of said pair being such a main clocked circuit and the other clocked circuit of the pair being such a dummy clocked circuit;

said main clocked circuit of each pair is clocked by said clock signal, and has an output connected operatively to one of said inputs of said analog circuitry for applying one of said digital control signals thereto, and is operable selectively to cause that digital control signal to change at said times;

said dummy clocked element of each pair is also clocked by the clock signal, and serves to produce a dummy signal at an output thereof, and is operable selectively to cause that dummy signal to change at said times; and said control circuitry is connected with both clocked circuits of each pair and are operable at one of said times at which no change occurs in said digital control signal of the pair to cause such a change to occur in said dummy signal of the pair, and are also operable at one of said times at which there is such a change in said digital control signal of the pair to prevent such a change from occurring in said dummy signal of the pair, and wherein said analog circuitry comprises a plurality of circuitry segments corresponding respectively to said inputs of the analog circuitry, each segment comprising a current source or current sink circuit, and the or each said analog signal is derived by summing the respective currents sourced, or sunk as the case may be, by the current source/sink circuits of selected ones of said circuitry segments of the analog circuitry, the selection of the circuitry segments being determined by said digital control signals.

* * * * *